United States Patent
Shih

(10) Patent No.: US 9,576,931 B1
(45) Date of Patent: Feb. 21, 2017

(54) METHOD FOR FABRICATING WAFER LEVEL PACKAGE

(71) Applicant: INOTERA MEMORIES, INC., Taoyuan (TW)

(72) Inventor: Shing-Yih Shih, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 15/047,632

(22) Filed: Feb. 19, 2016

(51) Int. Cl.
*B65D 85/00* (2006.01)
*H01L 33/48* (2010.01)
*H01L 23/00* (2006.01)
*H01L 21/56* (2006.01)
*H01L 21/683* (2006.01)
*H01L 21/3105* (2006.01)
*H01L 21/78* (2006.01)

(52) U.S. Cl.
CPC ......... *H01L 24/96* (2013.01); *H01L 21/31053* (2013.01); *H01L 21/561* (2013.01); *H01L 21/565* (2013.01); *H01L 21/568* (2013.01); *H01L 21/6835* (2013.01); *H01L 21/78* (2013.01); *H01L 24/11* (2013.01); *H01L 2221/68359* (2013.01); *H01L 2224/0231* (2013.01); *H01L 2224/13024* (2013.01)

(58) Field of Classification Search
CPC .................................. H01L 33/48; B65D 85/00
See application file for complete search history.

(56) References Cited

U.S. PATENT DOCUMENTS

| 2009/0302439 | A1* | 12/2009 | Pagaila | H01L 23/29 257/660 |
| 2011/0006408 | A1* | 1/2011 | Liao | H01L 21/561 257/660 |
| 2016/0005936 | A1* | 1/2016 | Illek | H01L 33/005 438/27 |
| 2016/0141262 | A1* | 5/2016 | Hu | H01L 24/17 257/738 |

* cited by examiner

*Primary Examiner* — Mohammad Choudhry
(74) *Attorney, Agent, or Firm* — Winston Hsu; Scott Margo

(57) ABSTRACT

A method for fabricating a wafer level package is disclosed. A carrier is provided. A redistributed layer (RDL) layer is formed on the carrier. Semiconductor dies are mounted on the RDL layer. The semiconductor dies are molded with a molding compound, thereby forming a molded wafer. A grinding process is then performed to remove a central portion of the molding compound, thereby forming a recess and an outer peripheral ring portion surrounding the recess. The carrier is then removed to expose a lower surface of the RDL layer. Solder bumps or solder balls are formed on the lower surface of the RDL layer.

6 Claims, 5 Drawing Sheets

300

METHOD FOR FABRICATING WAFER LEVEL PACKAGE

BACKGROUND OF THE INVENTION

1. Field of the Invention

The present invention relates generally to the field of semiconductor packaging. More particularly, the present invention relates to a method for fabricating a wafer level package (WLP).

2. Description of the Prior Art

The semiconductor technologies are developing very fast, and especially semiconductor dies have a tendency toward miniaturization. However, the requirements for the functions of the semiconductor dies have an opposite tendency to variety. Namely, the semiconductor dies must have more I/O pads into a smaller area, so the density of the pins is raised quickly. It causes the packaging for the semiconductor dies to become more difficult.

As known in the art, wafer level package (WLP) packages the dies on a wafer before dividing the dies into respective dies. The WLP technology has some advantages, such as a shorter producing cycle time and lower cost. Fan-out wafer-level packaging (FOWLP) is a packaging process in which contacts of a semiconductor die are redistributed over a larger area through a redistribution layer (RDL) that is typically formed on a substrate such as a TSV interposer.

The RDL is typically defined by the addition of metal and dielectric layers onto the surface of the wafer to re-route the I/O layout into a looser pitch footprint. Such redistribution requires thin film polymers such as BCB, PI or other organic polymers and metallization such as Al or Cu to reroute the peripheral pads to an area array configuration.

In conventional wafer level package processes, two or three temporary carrier bonding processes for wafer handling are required. The carrier provides adequate mechanical support for the molded wafer when handling the wafer.

SUMMARY OF THE INVENTION

The present invention is directed to provide an improved method for fabricating a wafer level package (WLP).

According to one embodiment of the invention, a method for fabricating a wafer level package is disclosed. A carrier is provided. A redistributed layer (RDL) layer is formed on the carrier. Semiconductor dies are mounted on the RDL layer. The semiconductor dies are molded with a molding compound, thereby forming a molded wafer. A grinding process is then performed to remove a central portion of the molding compound, thereby forming a recess and an outer peripheral ring portion surrounding the recess. The carrier is then removed to expose a lower surface of the RDL layer. Solder bumps or solder balls are formed on the lower surface of the RDL layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figures 1, 2:
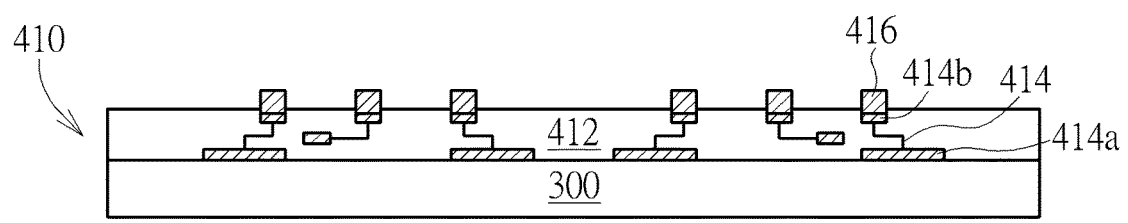
FIG. 1 to FIG. 10 are schematic diagrams showing an exemplary method for fabricating a wafer level package (WLP) according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" are used interchangeable throughout the specification.

The terms wafer and substrate used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Please refer to FIG. 1 to FIG. 10. FIG. 1 to FIG. 10 are schematic diagrams showing an exemplary method for fabricating a wafer level package (WLP) according to one embodiment of the invention. As shown in FIG. 1, a carrier 300 is prepared. The carrier 300 may be a releasable wafer-shaped substrate with an adhesive layer (not explicitly shown). For example, the carrier 300 may be a glass substrate, but is not limited thereto.

As shown in FIG. 2, a redistribution layer (RDL) layer 410 is formed on the carrier 300. The RDL layer 410 may comprise at least one dielectric layer 412 and at least one metal layer 414. The dielectric layer 412 may comprise organic materials such as polyimide (PI) or inorganic materials such as silicon nitride, silicon oxide or the like, but not limited thereto. The metal layer 414 may comprise aluminum, copper, tungsten, titanium, titanium nitride, or the like. Although not shown in this figure, it is understood that a passivation layer such as polyimide or silicon oxide may be provided between the RDL layer 410 and the carrier 300.

A plurality of bumps 416 such as micro-bumps may be formed on the RDL layer 410 for further connections. The bumps 416 may be directly formed on respective bump pads 414b in the metal layer 414. The formation of the bumps 416 is known in the art and the details thereof are omitted.

Figure 3:
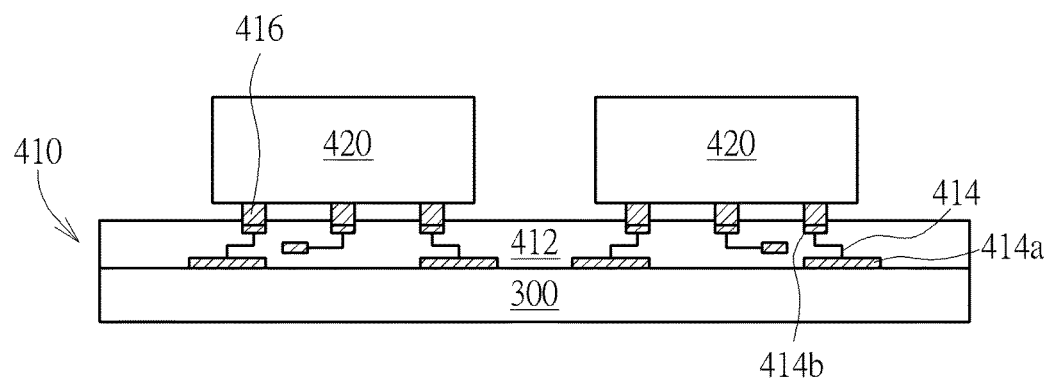

As shown in FIG. 3, after the formation of the bumps 416, individual flip-chips or dies 420 with their active sides facing down toward the RDL layer 410 are then mounted on the bumps 416 to thereby forming a stacked chip-to-wafer (C2W) construction. These individual flip-chips or dies 420 are active integrated circuit chips with certain functions, for example, GPU (graphic processing unit), CPU (central processing unit), memory chips, etc. Optionally, an underfill (not shown) may be applied under each die 420. Optionally, a thermal process may be performed to reflow the bumps 416.

Figure 4:
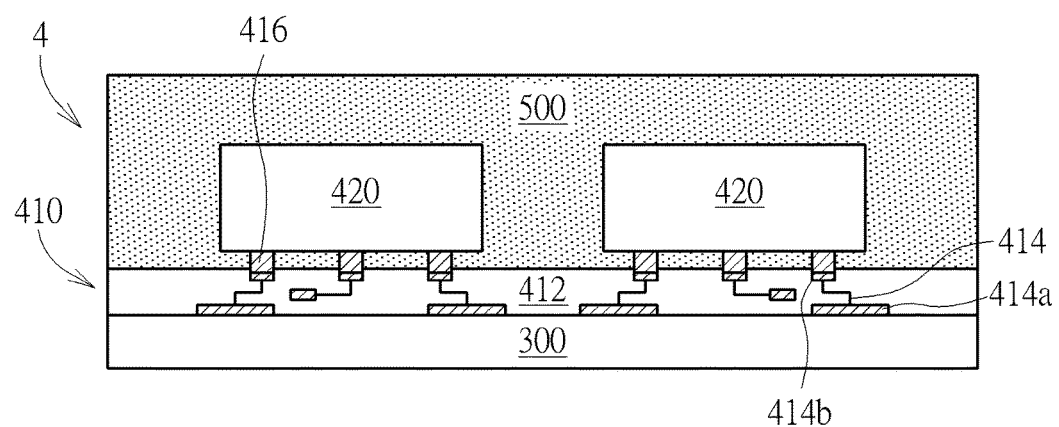

As shown in FIG. 4, after the die-bonding process, a molding compound 500 is applied. The molding compound 500 covers the attached dies 420 and the top surface of the RDL layer 410, thereby forming a molded wafer 4. The molding compound 500 may be subjected to a curing process. The mold compound 500 may comprise a mixture of epoxy and silica fillers, but not limited thereto.

Figure 5:
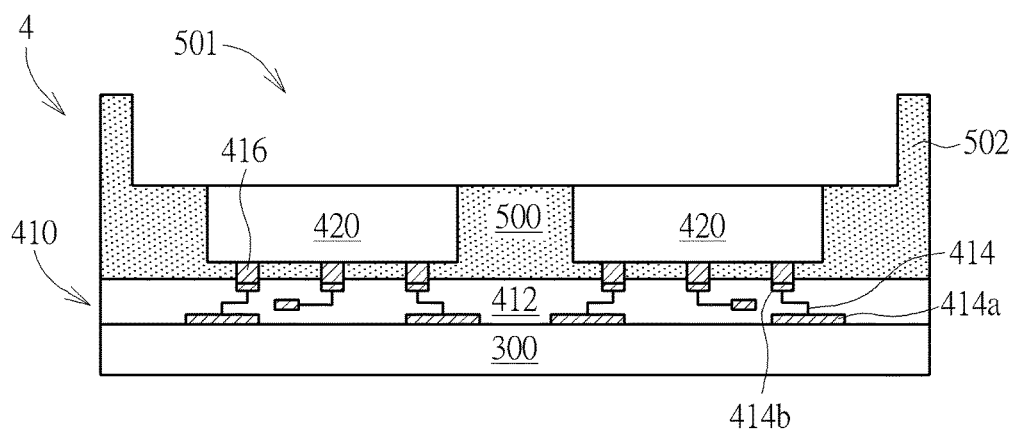

As shown in FIG. 5, a grinding process is carried out to remove the molding compound 500 from a central region of the carrier 300. An outer peripheral ring portion 502 of the molding compound 500 is left thick to a predetermined width, and only a central portion of the molding compound 500 is thinned to form a recess 501 in place. It is understood that during the grinding process, an upper portion of each of the dies 420 may be removed.

Figure 6:
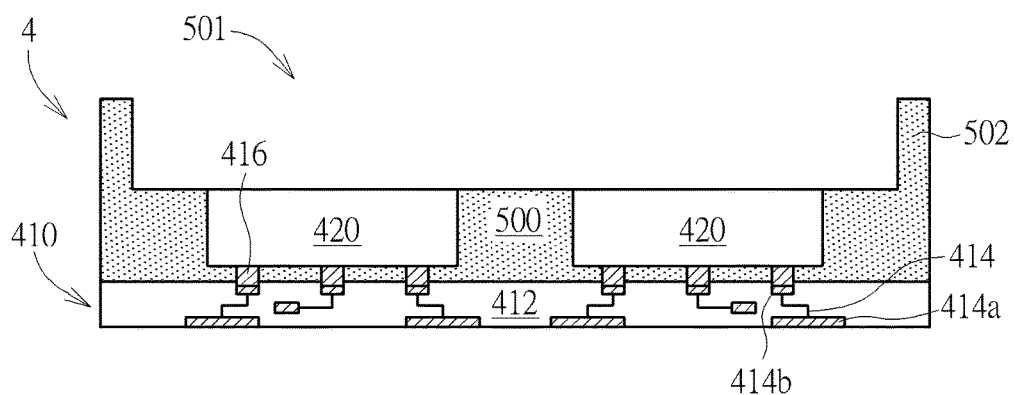

As shown in FIG. 6, after the grinding process, the carrier 300 is removed. Since the outer peripheral ring portion 502 provides adequate mechanical support to the molded wafer 4, there is no need to performing another temporary carrier bonding process before removing the carrier 300. The debonding of the carrier 300 may be performed by using a laser process or UV irradiation process, but not limited thereto. After removing the carrier 300, a lower surface of the RDL layer 410 is exposed.

Figure 7:
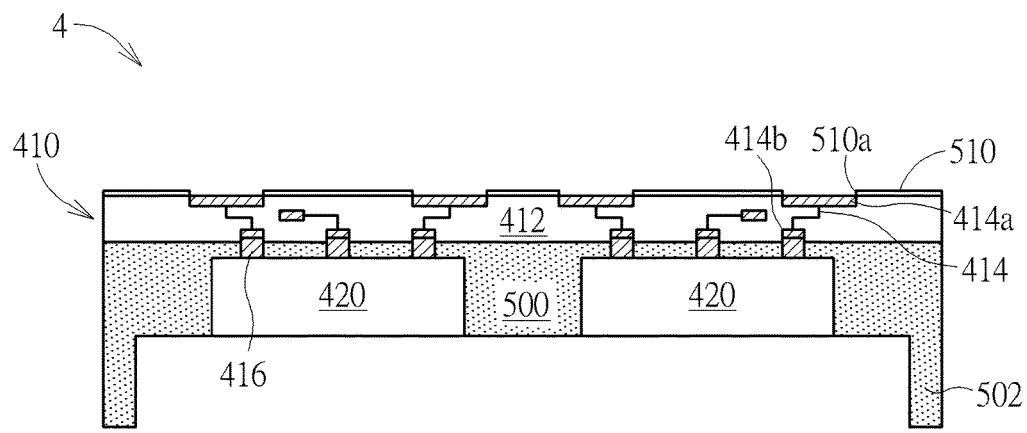
Figure 8:
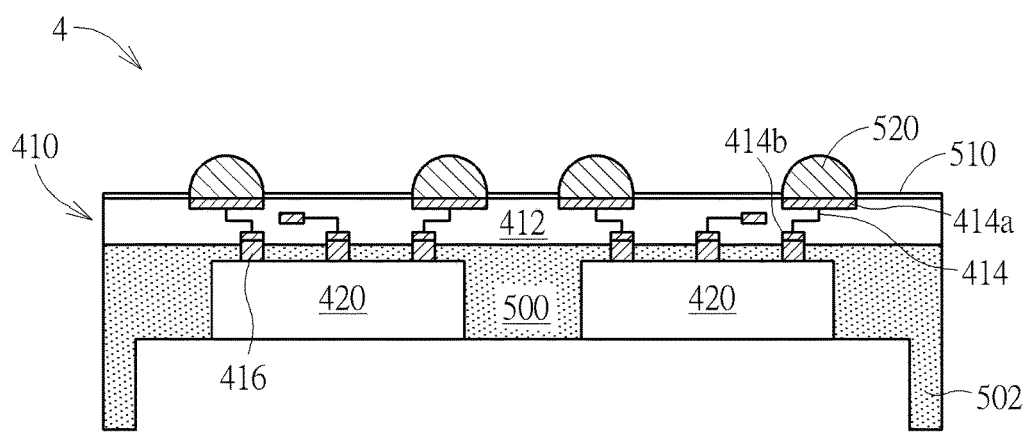

As shown in FIG. 7, a solder mask 510 is formed on the exposed lower surface of the RDL layer 410. Openings 510*a* are formed in the solder mask 510 to expose respective ball pads 414*a* of the RDL layer 410. Subsequently, solder bumps or solder balls 520 may be formed on the respective ball pads 414*a*. It is understood that an under-bump metallurgy (UBM) layer may be formed under each of the solder bumps or solder balls 520 in some embodiments.

Figure 9:
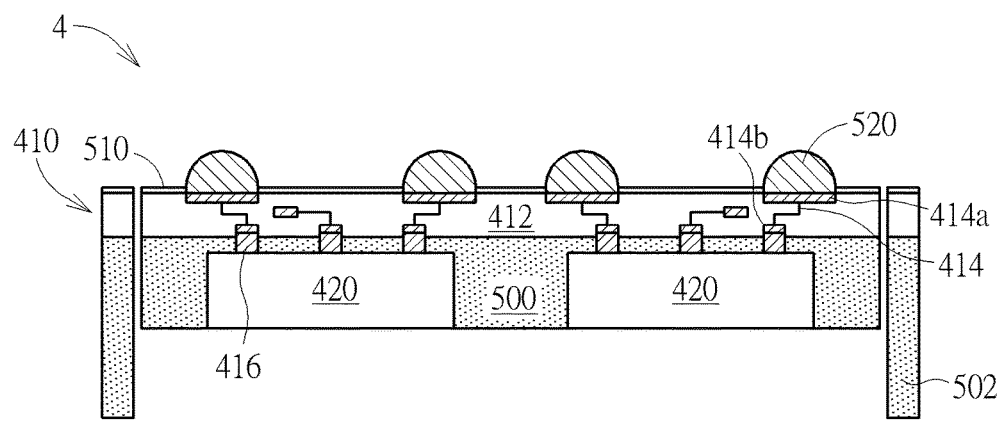

As shown in FIG. 9, a cutting process is performed to cut through the molding compound 500, the RDL layer 410, and the solder mask 510 along the perimeter of the recess 501, thereby separating the outer peripheral ring portion 502 from the molded wafer 4.

Figure 10:
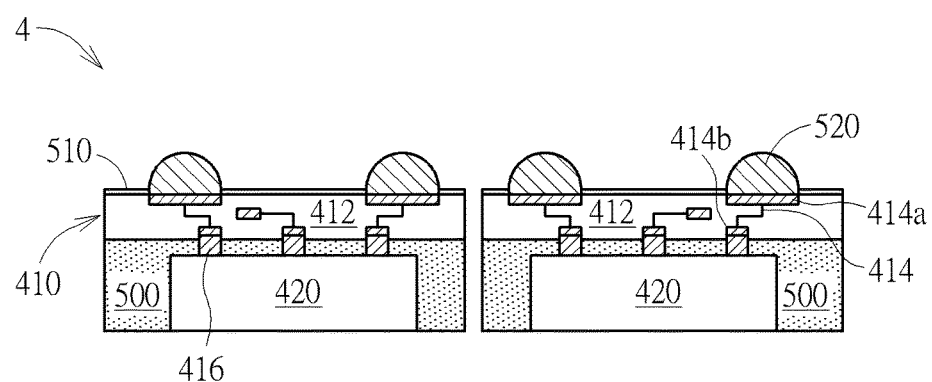

As shown in FIG. 10, a wafer dicing process is performed to separate individual wafer level packages 10 from one another.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a wafer level package, comprising:
   providing a carrier;
   forming a redistributed layer (RDL) layer on the carrier;
   mounting semiconductor dies on the RDL layer;
   molding the semiconductor dies with a molding compound, thereby forming a molded wafer;
   subjecting the molded wafer to a grinding process to remove only a central portion of the molding compound from the molded wafer, thereby forming a recess in place of the removed central portion of the molding compound and an outer peripheral ring portion surrounding the recess, wherein the outer peripheral ring portion is thicker than the central portion;
   removing the carrier to expose a lower surface of the RDL layer; and
   forming solder bumps or solder balls on the lower surface of the RDL layer.

2. The method for fabricating a wafer level package according to claim 1, wherein after removing the carrier, the method further comprises:
   forming a solder mask on the lower surface of the RDL layer; and
   forming openings in the solder mask to expose respective ball pads of the RDL layer.

3. The method for fabricating a wafer level package according to claim 2, wherein the solder bumps or solder balls are formed on the respective ball pads.

4. The method for fabricating a wafer level package according to claim 1, wherein after forming the solder bumps or solder balls, the method further comprises:
   performing a cutting process to separating the outer peripheral ring portion from the molded wafer; and
   performing a wafer dicing process to separate individual wafer level packages from one another.

5. The method for fabricating a wafer level package according to claim 1, wherein before mounting the semiconductor dies on the RDL layer, the method further comprises:
   forming a plurality of bumps on the RDL layer.

6. The method for fabricating a wafer level package according to claim 1, wherein the RDL layer comprises at least one dielectric layer and at least one metal layer.

* * * * *

UNITED STATES PATENT AND TRADEMARK OFFICE
CERTIFICATE OF CORRECTION

PATENT NO. : 9,576,931 B1  
APPLICATION NO. : 15/047632  
DATED : February 21, 2017  
INVENTOR(S) : Shing-Yih Shih Page 1 of 1

It is certified that error appears in the above-identified patent and that said Letters Patent is hereby corrected as shown below:

In the Specification

Column 1, Line 67, change "constitute apart of" to --constitute a part of--  
Column 3, Line 1, change "(C2 W)" to --(C2W)--

Signed and Sealed this  
Fifth Day of September, 2017

Joseph Matal  
*Performing the Functions and Duties of the*  
*Under Secretary of Commerce for Intellectual Property and*  
*Director of the United States Patent and Trademark Office*